United States Patent [19]

Kabat et al.

[11] Patent Number: 5,367,761
[45] Date of Patent: Nov. 29, 1994

[54] PRINTED CIRCUIT BOARD ASSEMBLY EXTRACTOR TOOL

[75] Inventors: Zbigniew Kabat, Chicago; Richard A. Walton, Carol Stream, both of Ill.

[73] Assignee: AG Communication Systems Corporation, Phoenix, Ariz.

[21] Appl. No.: 952,230

[22] Filed: Sep. 28, 1992

[51] Int. Cl.$^5$ .................. H01R 43/00; H05K 13/00
[52] U.S. Cl. .......................... 29/764; 29/267; 29/758
[58] Field of Search .............. 29/762, 764, 426.5, 29/267, 758

[56] References Cited

U.S. PATENT DOCUMENTS

| | | | |
|---|---|---|---|
| 3,896,535 | 7/1975 | Tucci | 29/764 |
| 4,519,130 | 5/1985 | Schaefer | 29/764 |
| 5,163,219 | 11/1992 | Akulow et al. | 29/764 |

Primary Examiner—Carl E. Hall
Attorney, Agent, or Firm—Gregory G. Hendricks

[57] ABSTRACT

The Printed Circuit Board Assembly Extraction Tool is designed to provide a method for removing Printed Circuit Board Assemblies from card file assemblies. The Extraction Tool is provided with a rubber bumper that protects the card file designation strip from damage during the extraction process. Also provided is an handle design that accommodates spare rubber bumpers. The handle also provides a way to remove PCBA's from the card file directly above panels by inclusion of a 15° offset in the handle design. The Extraction Tool design allows transfer of the extraction force to the same direction as PCBA removal. Finally, a channel is provided that acts to automatically deactivate card retainer strips while using the tool.

8 Claims, 4 Drawing Sheets

PRINTED CIRCUIT BOARD ASSEMBLY EXTRACTOR TOOL

FIELD OF THE INVENTION

The present invention relates to a Printed Circuit Board Assembly (PCBA) Extraction Tool, more specifically, an Extraction Tool that is used to aid the removal of PCBA's from card file assemblies.

BACKGROUND OF THE INVENTION

Today's large computing facility or telephone central office systems are generally constructed from several frames of equipment. Electrical functions or sub units are provided in increments of card files mounted within the frame. From time to time removal of Printed Circuit Board Assemblies (PCBA) is required to accomplish various functions. For example, an existing PCBA may be replaced by an improved version offering superior operating characteristics. Another example is replacement of a PCBA that has been diagnosed as defective. Insertion of the new PCBA must be preceded by removal of the old or existing PCBA.

Existing extraction tools have several negative side effects. First, use of existing extractor tools causes damage to the card file designation strips. Designation strips are used to denote which PCBA's are to be equipped in a given slot. Second, existing extraction tools are designed in a manner that exerts the applied removal force in a direction that opposes PCBA removal. Due to the existing tool design the PCBA is forced upward instead of outward. The tool works against the handle to remove the PCBA from the card file connector. As the force is applied upward, unnecessary force is exerted on the handle causing it to become loose. Also, existing tools cannot be used on PCBA's directly above the fuse panel. Lastly, some card file contains a built in card retainer made of mylar. Use of existing tools require manual deactivation or displacement of the mylar card retainer.

Therefore it is the objective of the present invention to provide an improved PCBA Extraction Tool. Such a new tool eliminates the negative side effects of PCBA removal while providing the basic removal function gracefully by its focus on providing proper force location and direction.

SUMMARY OF THE INVENTION

In order to accomplish the objective of the present invention there is provided a Printed Circuit Board Assembly Extraction Tool. The first embodiment of the invention provides for an extraction tool function corresponding to the existing tools but which does not have their deficiencies. A key feature is the incorporation of a rubber bumper to protect the text on designation strips. A second key feature is the design enhancement that provides PCBA extraction forces in the direction of PCBA removal. Also, the design of the new Extractor Tool accommodates the design of the fuse panel face plate and works in the file directly above the fuse panel. Finally, the present invention automatically deactivates or displaces the mylar card retainer during the PCBA extraction process. An auxiliary feature is the provision of spare rubber bumpers, which are contained within cavities internal to the Extractor Tool.

DESCRIPTION OF THE DRAWINGS

A better understanding of the invention may be had from the consideration of the following detailed description taken in conjunction with the accompanying drawings, in which.

DESCRIPTION OF THE PREFERRED EMBODIMENT

Figure 1:
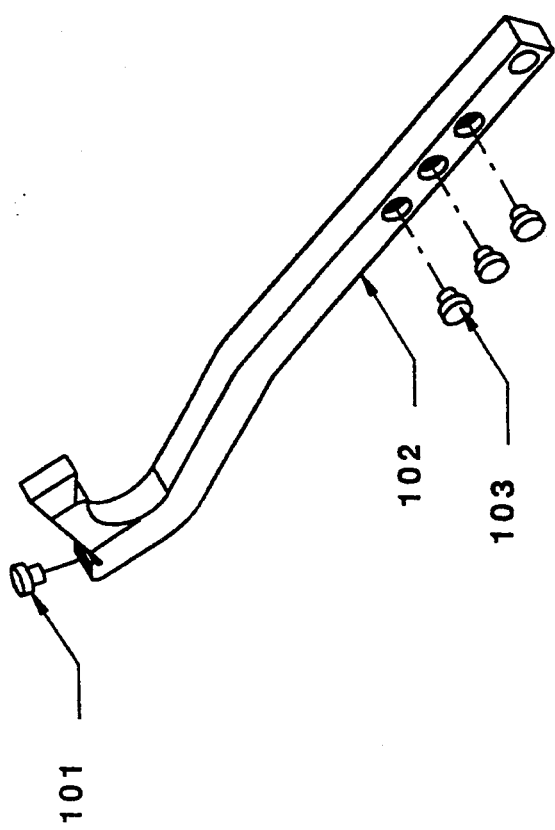
FIG. 1 shows a view of the present invention in its final form.

Referring first to FIG. 1 which shows a view of the final Extractor Tool assembly. The extractor 102 is constructed of aluminum alloy 6061-T6, finished with clear anodize. FIG. 1 shows the rubber bumper 101 inserted into the working end of the tool. Also, shown are the three spare bumpers 103 and their orientation within the handle of the tool.

Figure 2:
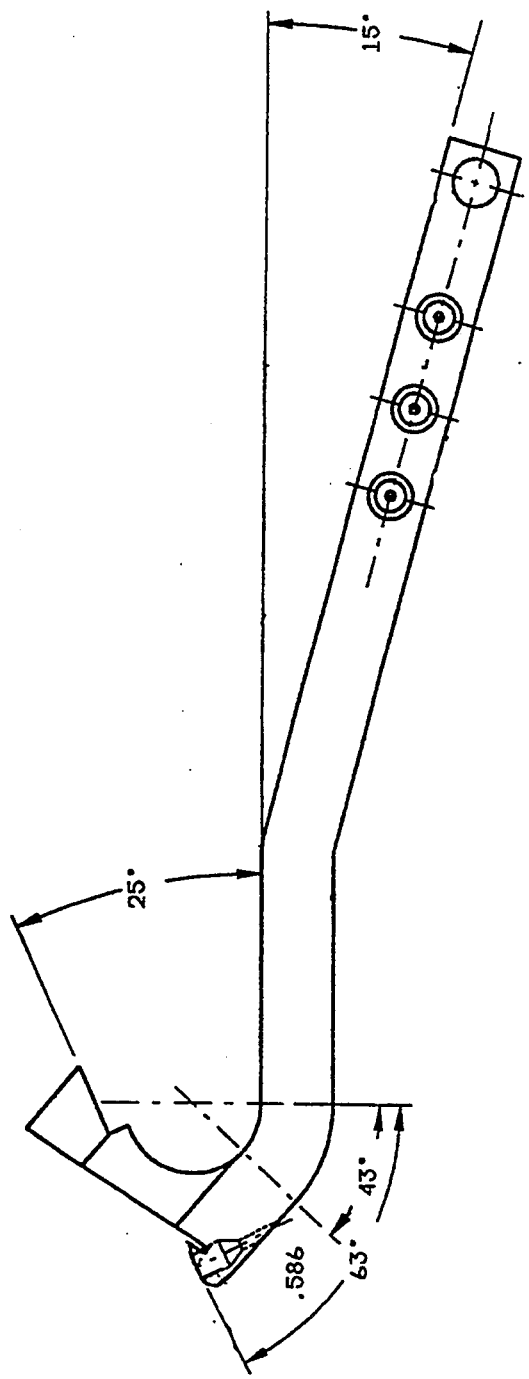
FIG. 2 shows a view of the present invention complete with manufacturing details.
Figure 2:
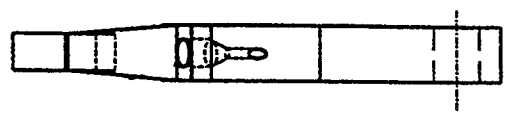

Referring next to FIG. 2, the details of the construction of the tool are shown. Key to allowing operation of this tool in card files located directly above the fuse panel is the 15° angle on the right side of the handle. The dimensions on the left side of the handle are key to engaging properly with the PCBA handle for removal purposes.

Figure 4:
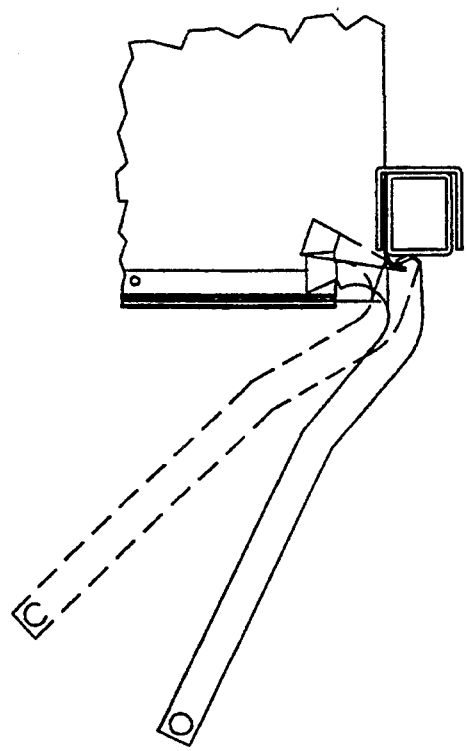
FIG. 4 shows the present invention in a first application of removal of Printed Circuit Board Assemblies.
Figure 3:
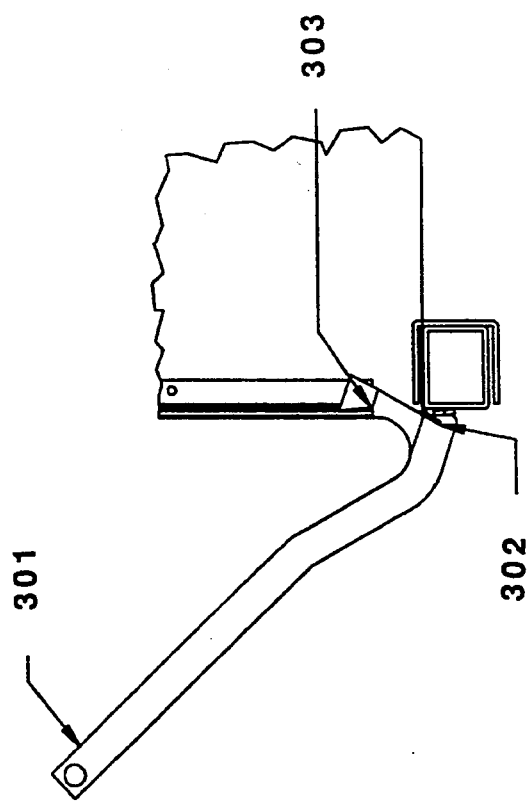
FIG. 3 shows the present invention in a first application of removal of Printed Circuit Board Assemblies.

Referring next to FIGS. 3 and 4, the present invention is shown in its first application. FIG. 3 shows the Extraction Tool's position at the beginning of the extraction process. The innovative 15° of angle 301 is shown. FIG. 4 shows how the design properly transfers extraction forces parallel to the direction of PCBA extraction. Also shown in FIG. 3 is the way the rubber bumper protects the card file designation strip, and the way the tool face contacts PCBA handle 303. A mylar retainer is shown mounted below the PCBA and engaged in channel 302 of the extraction tool. The retainer is slotted such that the PCBA extends through and below it. When the retainer is not engaged in slot 302 of the extraction tool, it extends beyond the edge of the PCBA, and since that portion of the retainer is not slotted, it prevents the PCBA from being removed from the card file in which it is mounted. However, when the retainer is engaged in slot 302 and the extraction tool is used to engage the PCBA and extract it from the card file, the retainer is bent away from the PCBA, thereby allowing the PCBA to be removed from the card file. A channel 302 in the extraction tool is strategically placed to accept the mylar card retainer. As the extraction tool is used to remove the PCBA, the mylar retainer is pushed down, deactivating or displacing the retaining feature.

Figure 6:
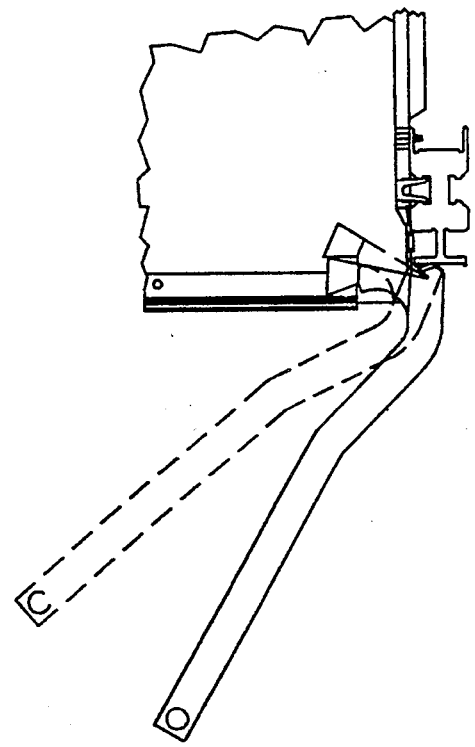
FIG. 6 shows the present invention in a second application of removal of Printed Circuit Board Assemblies.
Figure 5:
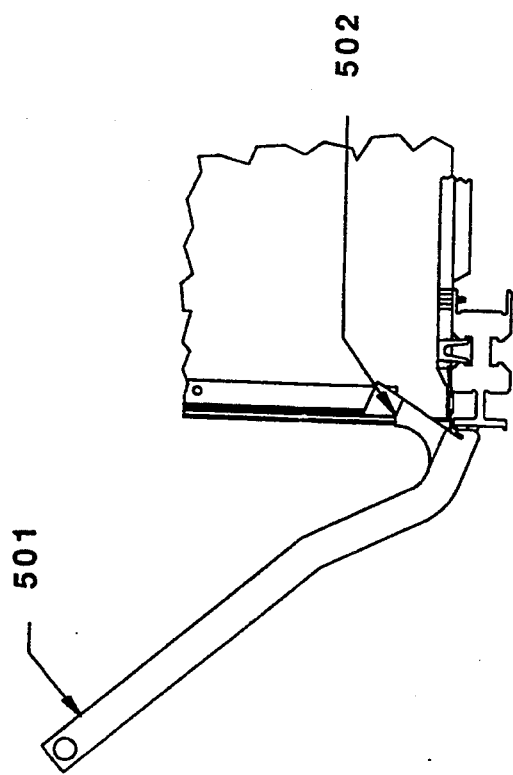
FIG. 5 shows the present invention in a second application of removal of Printed Circuit Board Assemblies.

Referring finally to FIGS. 5 and 6, the present invention is shown in an alternative application. Again FIG. 5 shows the Extraction Tool's position at the beginning of the extraction process and FIG. 6 shows how the design properly transfers extraction forces parallel to the direction of PCBA extraction. Also shown is the angle of handle 501, the way the tool face contacts PCBA handle 502 and the way the rubber bumper protects the card file designation strip. Note, however, in this particular application, the mylar retaining strip is not present.

In summary, the Printed Circuit Board Assembly Extraction Tool provides the extraction function while eliminating the problems experienced with existing versions of the extraction tool. Notably, a rubber bumper is provided to protect against damage of the card file designation strip. The handle design accommodates removal of PCBA's in the file directly above the fuse panel. Extraction forces are transferred from the present invention to the PCBA handle in the same direction as PCBA extraction. A channel in the tool provides for automatic deactivation or displacement of the mylar card retainer.

Although the preferred embodiment of the invention has been illustrated, and that form described, it is readily apparent to those skilled in the art that various modifications may be made therein without departing from the spirit of the invention or from the scope of the appended claims.

What is claimed is:

1. An extraction tool for removing a circuit card from a subsystem, a handle being rigidly attached to said circuit card, said subsystem including a card retainer of flat flexible material having two side members parallel to said circuit card which is positioned therebetween, and an end member connecting said side members and positioned across the edge of said circuit card, thereby retaining said circuit card in said subsystem, said extraction tool comprising:

a first member having a center line, a first end and a second end;

a second member having a center line, a first end rigidly attached to said first end of said first member in such a manner as to cause the center line of said second member to be displaced a first angle from said center line of said first member; and a third member having a first end rigidly attached to said second end of said second member and a second end being perpendicularly displaced a fixed distance from said center line of said first member, a card retainer slot positioned in said third member to engage said card retainer, and effective to bend said card retainer away from said circuit card when a force is applied to said extraction tool to extract said circuit card from said subsystem, whereby said second end of said third member mates to said handle and said first end of said third member mates with said subsystem, allowing a force applied to said second end of said first member to bend said card retainer away from said circuit card and force said handle in a direction perpendicular to said handle thereby extracting said circuit card from said subsystem.

2. An extraction tool as claimed in claim 1 wherein said first, said second and said third members have a rectangular cross-section.

3. An extraction tool as claimed in claim 1 wherein said third member is curved from said first end of said third member to said second end of said third member.

4. An extraction tool as claimed in claim 1 further comprising a protector means for protecting said subsystem while said circuit card is being extracted, said protection means being attached to said first end of said third member.

5. An extraction tool for removing a circuit card from a subsystem, a handle being rigidly attached to said circuit card, said subsystem including a card retainer of flat flexible material having two side members parallel to said circuit card which is positioned therebetween, and an end member connecting said side members and positioned across the edge of said circuit card, thereby retaining said circuit card in said subsystem, said extraction tool comprising:

a first member having a center line, a first end and a second end; and a second member having a first end rigidly attached to said first end of said first member and a second end being perpendicular displaced a fixed distance from said center line of said first member, a card retainer slot positioned in said third member to engage said card retainer, and effective to bend said card retainer away from said circuit card when a force is applied to said extraction tool to extract said circuit card from said subsystem, whereby said second end of said second member mates to said handle and said first end of said second member mates with said subsystem, allowing a force applied to said second end of said first member to bend said card retainer away from said circuit card and force said handle in a direction perpendicular to said handle thereby extracting said circuit card from said subsystem.

6. An extraction tool as claimed in claim 5 wherein said first and said second members have a rectangular cross-section.

7. An extraction tool as claimed in claim 5 wherein said second member is curved from said first end of said second member to said second end of said second member.

8. An extraction tool as claimed in claim 5 further comprising a protector means for protecting said subsystem while said circuit card is being extracted, said protection means being attached to said first end of said second member.

* * * * *